US012645041B2

(12) United States Patent
Lau et al.

(10) Patent No.: US 12,645,041 B2
(45) Date of Patent: Jun. 2, 2026

(54) PACKAGE STRUCTURE

(71) Applicant: Unimicron Technology Corp., Taoyuan (TW)

(72) Inventors: John Hon-Shing Lau, Taoyuan (TW); Pu-Ju Lin, Hsinchu (TW); Kai-Ming Yang, Hsinchu County (TW); Chen-Hao Lin, Keelung (TW); Cheng-Ta Ko, Taipei (TW); Tzyy-Jang Tseng, Taoyuan (TW)

(73) Assignee: Unimicron Technology Corp., Taoyuan City (TW)

( * ) Notice: Subject to any disclaimer, the term of this patent is extended or adjusted under 35 U.S.C. 154(b) by 317 days.

(21) Appl. No.: 18/623,035

(22) Filed: Apr. 1, 2024

(65) Prior Publication Data

US 2024/0248264 A1 Jul. 25, 2024

Related U.S. Application Data

(63) Continuation-in-part of application No. 18/331,943, filed on Jun. 9, 2023, now Pat. No. 12,412,879, which
(Continued)

(51) Int. Cl.
*G02B 6/42* (2006.01)
*G02B 6/12* (2006.01)
*H10W 90/00* (2026.01)

(52) U.S. Cl.
CPC ......... *G02B 6/4257* (2013.01); *G02B 6/4206* (2013.01); *G02B 6/4293* (2013.01);
(Continued)

(58) Field of Classification Search
None
See application file for complete search history.

(56) References Cited

U.S. PATENT DOCUMENTS 11,094,682 B2 * 8/2021 Islam .................... H10W 90/00
2006/0078248 A1 * 4/2006 Sasaki .................. H10W 72/00
257/E27.128
(Continued)

FOREIGN PATENT DOCUMENTS

CN        109309061 A        2/2019
CN        114156730 A        3/2022
(Continued)

OTHER PUBLICATIONS

"Office Action of Taiwan Counterpart Application", issued on Jan. 10, 2025, p. 1-p. 6.
(Continued)

*Primary Examiner* — Jerry Rahll
(74) *Attorney, Agent, or Firm* — JCIPRNET

(57) ABSTRACT

Disclosed is a package structure including a circuit board, a co-packaged optics (CPO) substrate, an application specific integrated circuit (ASIC) assembly, a glass interposer, an electronic integrated circuit (EIC) assembly, a photonic integrated circuit (PIC) assembly, and an optical fiber assembly. The CPO substrate is configured on the circuit board, and the ASIC assembly is configured on the CPO substrate. The glass interposer is configured on the CPO substrate and includes an upper surface, a lower surface, a cavity, and at least one through glass via (TGV). The EIC assembly is configured on the upper surface of the glass interposer and electrically connected to the glass interposer. The PIC assembly is configured in the cavity of the glass interposer and electrically connected to the glass interposer. The optical fiber assembly is configured on the lower surface of the glass interposer and optically connected to the PIC assembly.

10 Claims, 2 Drawing Sheets

100

Related U.S. Application Data is a continuation-in-part of application No. 17/835,990, filed on Jun. 9, 2022, now Pat. No. 11,860,428.

(52) U.S. Cl.
CPC ......... *G02B 6/12004* (2013.01); *H10W 90/00* (2026.01); *H10W 90/701* (2026.01)

(56) References Cited

U.S. PATENT DOCUMENTS

| | | | | |
|---|---|---|---|---|
| 2013/0279844 | A1* | 10/2013 | Na | G02B 6/124 |
| | | | | 438/27 |
| 2013/0308898 | A1* | 11/2013 | Doerr | G02B 6/12 |
| | | | | 385/14 |
| 2014/0321803 | A1* | 10/2014 | Thacker | G02B 6/4274 |
| | | | | 385/14 |
| 2014/0321804 | A1* | 10/2014 | Thacker | G02B 6/4274 |
| | | | | 385/14 |
| 2015/0098677 | A1* | 4/2015 | Thacker | G02B 6/12 |
| | | | | 385/14 |
| 2016/0085038 | A1* | 3/2016 | Decker | G02B 6/428 |
| | | | | 385/14 |
| 2019/0146166 | A1* | 5/2019 | Wang | G02B 6/4246 |
| | | | | 385/14 |
| 2021/0074600 | A1* | 3/2021 | Jeng | H10W 70/635 |
| 2021/0225824 | A1* | 7/2021 | Islam | H10W 90/00 |
| 2023/0314733 | A1* | 10/2023 | Moret | G02B 6/428 |
| 2023/0384543 | A1* | 11/2023 | Hsia | G02B 6/4271 |

FOREIGN PATENT DOCUMENTS

| | | |
|---|---|---|
| TW | 202322303 | 6/2023 |
| TW | 202322327 | 6/2023 |
| TW | 202350024 | 12/2023 |

OTHER PUBLICATIONS

"Office action of related China Application No. 202310681641.7", issued on Sep. 17, 2025, p. 1-p. 9.

* cited by examiner

PACKAGE STRUCTURE

CROSS-REFERENCE TO RELATED APPLICATION

This application is a continuation-in-part application of and claims the priority benefit of U.S. application Ser. No. 18/331,943, filed on Jun. 9, 2023. The prior U.S. application Ser. No. 18/331,943 is a continuation-in-part application of and claims the priority benefit of U.S. application Ser. No. 17/835,990, filed on Jun. 9, 2022. The entirety of each of the above-mentioned patent applications is hereby incorporated by reference herein and made a part of this specification.

BACKGROUND

Technical Field

The disclosure relates to a semiconductor structure, and in particular to a package structure.

Description of Related Art

High-performance computing (HPC) has become more popular and is widely used in advanced networking and server applications, and in particular in artificial intelligence (AI) related products that require high data rates, gradually increasing bandwidths, and gradually decreasing delays. In recent years, a co-packaged optics (CPO) framework has emerged, where an application specific integrated circuit (ASIC) assembly, an electronic integrated circuit (EIC) assembly, and a photonic integrated circuit (PIC) assembly are placed on the same package substrate having thin film redistribution layers side by side to be electrically connected to one another through the thin film redistribution layers to implement optical/electrical signal conversion and transmission.

Public expectations and requirements for high-density package carrier substrate for package structures with HPC have increased. For example, the line width and the line spacing for metal layers are required to be increasingly smaller, and the thickness of the dielectric layer of the redistribution circuit layer is required to be increasingly thinner. The current build-up package substrate cannot meet these requirements. In some industries, an additional through silicon via (TSV) interposer on the build-up package substrate is further proposed. Although the TSV interposer may solve the above-mentioned issues, the TSV interposer is extremely costly. In addition, since the ASIC assembly, the EIC assembly, and the PIC assembly are placed side by side, the required area of the thin film redistribution layer is relatively large, making it impossible to reduce the area of the package substrate.

SUMMARY

The disclosure provides a package structure that solves the issues of the prior art and has a lower cost as well as a higher density and performance.

The package structure of the disclosure includes a circuit board, a co-packaged optics (CPO) substrate, an application specific integrated circuit (ASIC) assembly, a glass interposer, an electronic integrated circuit (EIC) assembly, a photonic integrated circuit (PIC) assembly, and an optical fiber assembly. The CPO substrate is configured on the circuit board and electrically connected to the circuit board. The ASIC assembly is configured on the CPO substrate and electrically connected to the CPO substrate. The glass interposer is configured on the CPO substrate and electrically connected to the CPO substrate. The glass interposer includes an upper surface and a lower surface opposite to each other, a cavity extending from the lower surface toward the upper surface, and at least one through glass via penetrating the glass interposer and connecting the upper surface and the lower surface. The EIC assembly is configured on the upper surface of the glass interposer and electrically connected to the glass interposer. The PIC assembly is configured in the cavity of the glass interposer and electrically connected to the glass interposer. The optical fiber assembly is configured on the lower surface of the glass interposer assembly is configured in the cavity of the glass interposer and electrically connected to the glass interposer. The optical fiber assembly is configured on the lower surface of the glass interposer and optically connected to the PIC assembly.

In an embodiment of the disclosure, the optical fiber assembly includes a plurality of glass waveguides, an optical coupler, and an optical fiber cable. The plurality of glass waveguides are configured on the glass interposer and extend to connect to the PIC assembly. The optical fiber cable passes through the optical coupler and is optically connected to the PIC assembly through the plurality of glass waveguides.

In an embodiment of the disclosure, the PIC assembly includes at least one photodiode and at least one laser diode, and the plurality of glass waveguides are connected to the at least one photodiode and the at least one laser diode.

In an embodiment of the disclosure, the package structure further includes a plurality of connecting members configured between the CPO substrate and the circuit board. The CPO substrate is electrically connected to the circuit board through the plurality of connecting members.

In an embodiment of the disclosure, the package structure further includes a plurality of connecting members configured between the glass interposer and the CPO substrate. The glass interposer is electrically connected to the CPO substrate through the plurality of connecting members.

In an embodiment of the disclosure, the package structure further includes a plurality of connecting members configured between the ASIC assembly and the CPO substrate. The ASIC assembly is electrically connected to the CPO substrate through the plurality of connecting members.

In an embodiment of the disclosure, the package structure further includes a plurality of connecting members configured between the EIC assembly and the glass interposer. The EIC assembly is electrically connected to the glass interposer through the plurality of connecting members.

In an embodiment of the disclosure, the package structure further includes a plurality of connecting members configured between the PIC assembly and the glass interposer. The PIC assembly is electrically connected to the glass interposer through the plurality of connecting members.

In an embodiment of the disclosure, an orthogonal projection of the EIC assembly on the glass interposer overlaps an orthogonal projection of the PIC assembly on the glass interposer.

In an embodiment of the disclosure, the CPO substrate includes a build-up package substrate or an organic interposer.

Based on the above, in the package structure of the disclosure, the ASIC assembly is configured on the CPO substrate, the EIC assembly and the PIC assembly are heterogeneously integrated on the CPO substrate through the glass interposer, and the optical fiber assembly is configured on the glass interposer and optically connected to the PIC assembly. Compared to the existing technology, which uses a through silicon via interposer substrate, the package structure of the disclosure not only meets the public expectations and requirements for a high-density package structure, but also has a lower cost and a high performance.

To make the aforementioned more comprehensible, several embodiments accompanied with drawings are described in detail as follows.

DESCRIPTION OF THE EMBODIMENTS

The embodiments of the disclosure can be understood together with the drawings, and the drawings of the disclosure are also regarded as part of the description of the disclosure. It is understood that the drawings of the disclosure are not drawn to scale. In fact, the size of an element may be arbitrarily exaggerated or reduced to clearly illustrate the features of the disclosure.

Figure 1:
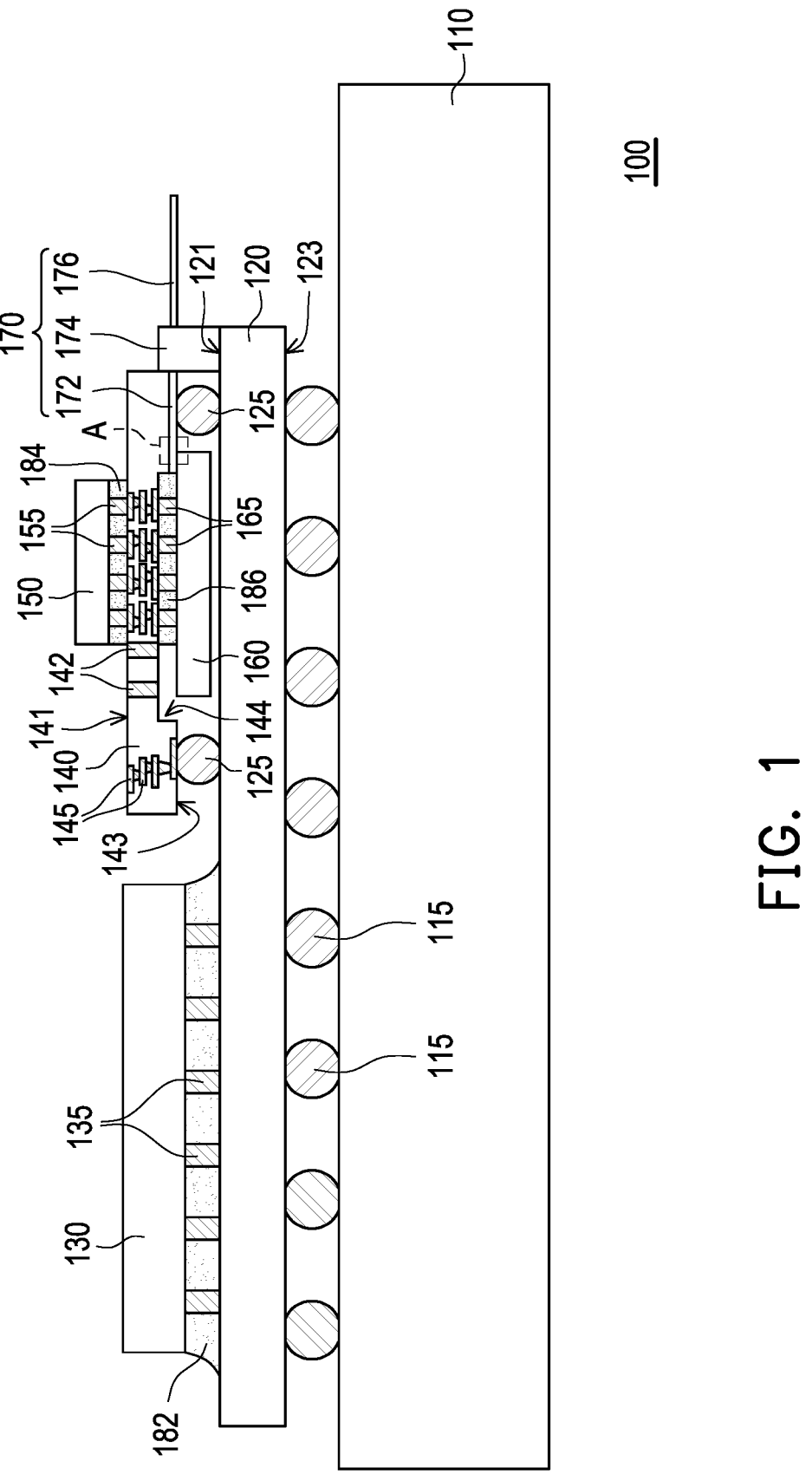
FIG. 1 is a cross-sectional schematic diagram of a package structure according to an embodiment of the disclosure.
Figure 2:
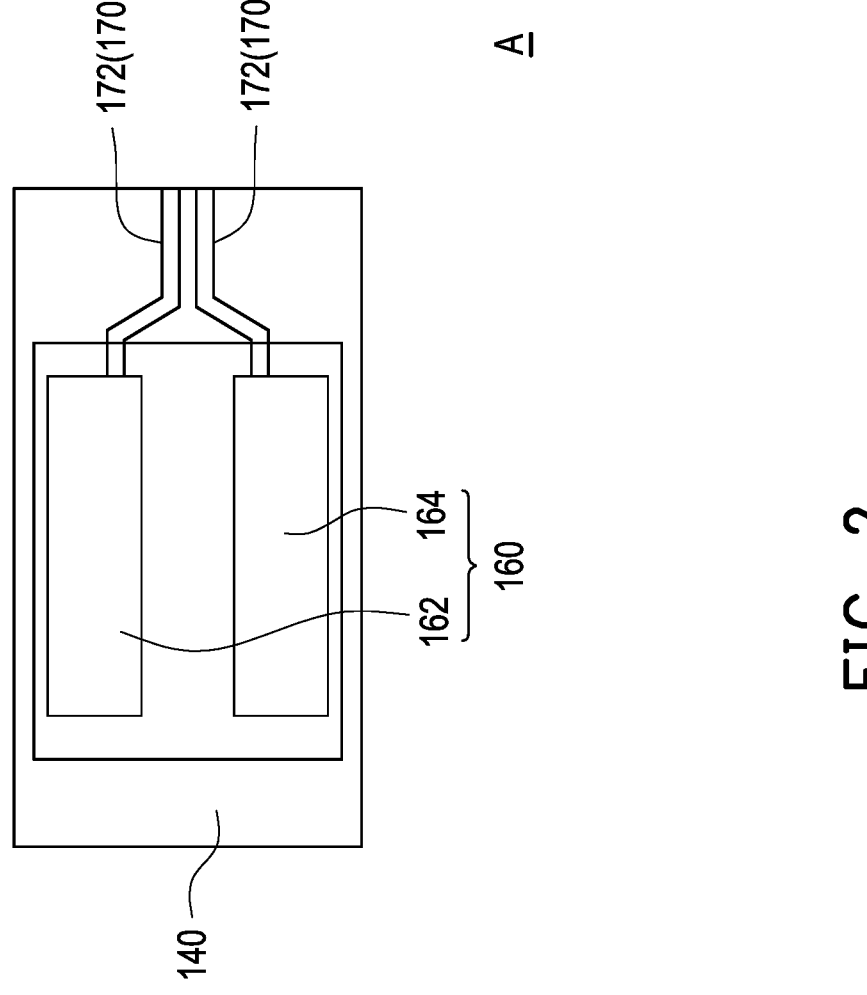
FIG. 2 is a top schematic diagram of an area A in FIG. 1.

FIG. 1 is a cross-sectional schematic diagram of a package structure according to an embodiment of the disclosure. FIG. 2 is a top schematic diagram of an area A in FIG. 1.

Please refer to FIG. 1 first. In this embodiment, a package structure 100 includes a circuit board 110, a CPO substrate 120, an application specific integrated circuit (ASIC) assembly 130, a glass interposer 140, an electronic integrated circuit (EIC) assembly 150, a photonic integrated circuit (PIC) assembly 160, and an optical fiber assembly 170. The CPO substrate 120 is configured on the circuit board 110 and electrically connected to the circuit board 110. The ASIC assembly 130 is configured on the CPO substrate 120 and electrically connected to the CPO substrate 120. The glass interposer 140 is configured on the CPO substrate 120 and electrically connected to the CPO substrate 120. The glass interposer 140 includes an upper surface 141 and a lower surface 143 opposite to each other, a cavity 144 extending from the lower surface 143 toward the upper surface 141, and at least one through glass via penetrating the glass interposer 140 and connecting the upper surface 141 and the lower surface 143 (two through glass vias 142 are schematically illustrated). The EIC assembly 150 is configured on the upper surface 141 of the glass interposer 140 and electrically connected to the glass interposer 140. The PIC assembly 160 is configured in the cavity 144 of the glass interposer 140 and electrically connected to the glass interposer 140. The optical fiber assembly 170 is configured on the lower surface 143 of the glass interposer 140 and optically connected to the PIC assembly 160.

Specifically, the circuit board 110 in this embodiment is, for example, a printed circuit board, but is not limited thereto. The CPO substrate 120 is, for example, a build-up package substrate or an organic interposer, but is not limited thereto. The CPO substrate 120 includes an upper surface 121 and a lower surface 123 opposite to each other. In this embodiment, the package structure 100 further includes a plurality of connecting members 115 configured between the lower surface 123 of the CPO substrate 120 and the circuit board 110, wherein the CPO substrate 120 is electrically connected to the circuit board 110 through the plurality of connecting members 115. In an embodiment, the connecting member 115 is, for example, a solder ball, but is not limited thereto.

The package structure 100 in this embodiment further includes a plurality of connecting members 135 configured between the ASIC assembly 130 and the upper surface 121 of the CPO substrate 120, wherein the ASIC assembly 130 is electrically connected to the CPO substrate 120 through the plurality of connecting members 135. In an embodiment, the connecting member 135 is, for example, a microbump, but is not limited thereto. To effectively protect an electrical connection relationship between the ASIC assembly 130 and the CPO substrate 120, the package structure 100 in this embodiment further includes an underfill 182 configured between the ASIC assembly 130 and the CPO substrate 120 and covering the plurality of connecting members 135. In an embodiment, a material of the primer 182 may be, for example, a resin, an epoxy resin, or a molding compound, but is not limited thereto.

Furthermore, the glass interposer 140 in this embodiment also includes a plurality of lines 145, wherein a layout design of the plurality of lines may be adjusted according to the requirements and is not limited herein. The plurality of lines 145 of the glass interposer 140 may also be electrically connected to the at least one through glass via 142 at a position that is not illustrated. In an embodiment, the line 145 may be, for example, a fan-out redistribution layer, but is not limited thereto.

The package structure 100 in this embodiment further includes a plurality of connecting members 125 configured between the lower surface 143 of the glass interposer 140 and the CPO substrate 120, wherein the glass interposer 140 is electrically connected to the CPO substrate 120 through the plurality of connecting members 125. In an embodiment, the connecting member 125 is, for example, a C4 bump or a C2 bump, but is not limited thereto.

Furthermore, the package structure 100 in this embodiment includes a plurality of connecting members 155 configured between the EIC assembly 150 and the upper surface 141 of the glass interposer 140, wherein the EIC assembly 150 is electrically connected to the glass interposer 140 through the plurality of connecting members 155. To effectively protect an electrical connection relationship between the EIC assembly 150 and the glass interposer 140, the package structure 100 in this embodiment further includes a primer 184 configured between the EIC assembly 150 and the glass interposer 140 and covering the plurality of connecting members 155. In an embodiment, a material of the primer 184 may be, for example, a resin, an epoxy resin, or a molding compound, but is not limited thereto.

In addition, the package structure 100 in this embodiment further includes a plurality of connecting members 165 configured between the PIC assembly 160 and the glass interposer 140, wherein the PIC assembly 160 is electrically connected to the glass interposer 140 through the plurality of connecting members 165. The plurality of connecting members 165 herein are located in the cavity 144 of the glass interposer 140. The connecting member 165 is, for example, a microbump, but is not limited thereto. To effectively protect an electrical connection relationship between the PIC assembly 160 and the glass interposer 140, the package structure 100 in this embodiment further includes a primer 186 configured between the PIC assembly 160 and the glass interposer 140 and covering the plurality of connecting members 165. In an embodiment, a material of the primer 186 may be, for example, a resin, an epoxy resin, or a molding compound, but is not limited thereto.

In an embodiment, an orthogonal projection of the EIC assembly 150 on the glass interposer 140 overlaps an orthogonal projection of the PIC assembly 160 on the glass interposer 140. An area of the orthogonal projection of the EIC assembly 150 on the glass interposer 140 may be smaller than an area of the orthogonal projection of the PIC assembly 160 on the glass interposer 140. That is, the EIC assembly 150 is 3D-stacked on the PIC assembly 160 through the glass interposer 140. In other words, the EIC assembly 150 and the PIC assembly 160 are heterogeneously integrated on the CPO substrate 120 through the glass interposer 140 and disposed side by side with the ASIC assembly 130.

It is noted that the plurality of connecting members 155, the plurality of connecting members 165, the plurality of lines 145, and the at least one through glass via 142 are exemplarily illustrated. Though in the cross-section illustrated in FIG. 1, the plurality of connecting members 155 and 165 are not connected to the at least one through glass via 142 of the glass interposer 140, the plurality of connecting members 155 and 165 may still be connected to the at least one through glass via 142 of the glass interposer 140 in other cross-sections that are not illustrated.

In addition, referring to both FIGS. 1 and 2, the optical fiber assembly 170 in this embodiment includes a plurality of glass waveguides 172, an optical coupler 174, and an optical fiber cable 176. The plurality of glass waveguides 172 are configured on the glass interposer 140 and extend to connect to the PIC assembly 160. The optical fiber cable 176 passes through the optical coupler 174 and is optically connected to the PIC assembly 160 through the plurality of glass waveguides 172. In an embodiment, a material of a glass waveguide 172 is, for example, a polymer, but is not limited thereto. In an embodiment, the PIC assembly 160 includes at least one photodiode (one photodiode 162 is schematically illustrated) and at least one laser diode (one laser diode 164 is schematically illustrated), and the plurality of glass waveguides 172 are connected to the photodiode 162 and the laser diode 164.

In an embodiment, an optical signal enters the photodiode 162 from the optical fiber cable 176. The optical signal is converted into an electrical signal by the photodiode 162, and the electrical signal is transmitted to a transimpedance amplifier (TIA) by the CPO substrate 120 and amplified. The amplified electrical signal is further transmitted to the ASIC assembly 130 through the CPO substrate 120. Then, the ASIC assembly 130 transmits the electrical signal to the laser diode 164 through the CPO substrate 120. The optical signal is emitted outward to the optical fiber cable 176 in the form of a laser for transmission to an external circuit (e.g., an interconnector).

Briefly, the package structure 100 in this embodiment is under the co-packaged optics (CPO), wherein the ASIC assembly 130 is configured on the CPO substrate 120, the EIC assembly 150 and the PIC assembly 160 are heterogeneously integrated on the CPO substrate 120 through the glass interposer 140, and the optical fiber assembly 170 is configured on the glass interposer 140 and is optically connected to the PIC assembly 160 through the plurality of glass waveguides 172. Compared to the existing technology, which uses the through silicon via interposer substrate, the package structure 100 in this embodiment not only meets the public expectations and requirements for a high-density package structure, but also has a lower cost and a high performance.

In summary, in the package structure of the disclosure, the ASIC assembly is configured on the CPO substrate, the EIC assembly and the PIC assembly are heterogeneously integrated on the CPO substrate through the glass interposer, and the optical fiber assembly is configured on the glass interposer and optically connected to the PIC assembly. Compared to the existing technology, which uses the through silicon via interposer substrate, the package structure of the disclosure not only meets the public expectations and requirements for a high-density package structure, but also has a lower cost and a high performance.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A package structure, comprising:
   a circuit board;
   a co-packaged optics substrate, configured on the circuit board and electrically connected to the circuit board;
   an application specific integrated circuit assembly, configured on the co-packaged optics substrate and electrically connected to the co-packaged optics substrate;
   a glass interposer, configured on the co-packaged optics substrate and electrically connected to the co-packaged optics substrate, wherein the glass interposer comprises an upper surface and a lower surface opposite to each other, a cavity extending from the lower surface toward the upper surface, and at least one through glass via penetrating the glass interposer and connecting the upper surface and the lower surface;
   an electronic integrated circuit assembly, configured on the upper surface of the glass interposer and electrically connected to the glass interposer;
   a photonic integrated circuit assembly, configured in the cavity of the glass interposer and electrically connected to the glass interposer; and
   an optical fiber assembly, configured on the lower surface of the glass interposer and optically connected to the photonic integrated circuit assembly.

2. The package structure of claim 1, wherein the optical fiber assembly comprises a plurality of glass waveguides, an optical coupler, and an optical fiber cable, wherein the plurality of glass waveguides are configured on the glass interposer and extend to connect to the photonic integrated circuit assembly, and the optical fiber cable passes through the optical coupler and is optically connected to the photonic integrated circuit assembly through the plurality of glass waveguides.

3. The package structure of claim 2, wherein the photonic integrated circuit assembly comprises at least one photodiode and at least one laser diode, and the plurality of glass waveguides are connected to the at least one photodiode and the at least one laser diode.

4. The package structure of claim 1, further comprising:
   a plurality of connecting members, configured between the co-packaged optics substrate and the circuit board, wherein the co-packaged optics substrate is electrically connected to the circuit board through the plurality of connecting members.

5. The package structure of claim 1, further comprising:
   a plurality of connecting members, configured between the glass interposer and the co-packaged optics substrate, wherein the glass interposer is electrically connected to the co-packaged optics substrate through the plurality of connecting members.

6. The package structure of claim 1, further comprising:

a plurality of connecting members, configured between the application specific integrated circuit assembly and the co-packaged optics substrate, wherein the application specific integrated circuit assembly is electrically connected to the co-packaged optics substrate through the plurality of connecting members.

7. The package structure of claim 1, further comprising:

a plurality of connecting members, configured between the electronic integrated circuit assembly and the glass interposer, wherein the electronic integrated circuit assembly is electrically connected to the glass interposer through the plurality of connecting members.

8. The package structure of claim 1, further comprising:

a plurality of connecting members, configured between the photonic integrated circuit assembly and the glass interposer, wherein the photonic integrated circuit assembly is electrically connected to the glass interposer through the plurality of connecting members.

9. The package structure of claim 1, wherein an orthogonal projection of the electronic integrated circuit assembly on the glass interposer overlaps an orthogonal projection of the photonic integrated circuit assembly on the glass interposer.

10. The package structure of claim 1, wherein the co-packaged optics substrate comprises a build-up package substrate or an organic interposer.

* * * * *